(12) United States Patent
Staines

(10) Patent No.: US 7,626,468 B2
(45) Date of Patent: Dec. 1, 2009

(54) MICROWAVE GENERATOR WITH VARIABLE FREQUENCY EMISSION

(75) Inventor: Geoffrey Staines, Röthenbach (DE)

(73) Assignee: Diehl BGT Defence GmbH & Co., KG, Uberlingen (DE)

(*) Notice: Subject to any disclaimer, the term of this patent is extended or adjusted under 35 U.S.C. 154(b) by 240 days.

(21) Appl. No.: 11/490,771

(22) Filed: Jul. 21, 2006

(65) Prior Publication Data

US 2007/0019414 A1 Jan. 25, 2007

(30) Foreign Application Priority Data

Jul. 22, 2005 (DE) .................. 10 2005 034 295

(51) Int. Cl.
*H03B 7/12* (2006.01)
(52) U.S. Cl. .................. 331/96; 331/126; 331/129; 331/131
(58) Field of Classification Search .................. 372/18, 372/101; 315/3.5; 343/756, 761; 342/36, 342/26 B, 59, 82; 331/53, 4, 96, 126, 129, 331/131; 333/222, 232
See application file for complete search history.

(56) References Cited

U.S. PATENT DOCUMENTS

| | | | |
|---|---|---|---|
| 3,748,528 A | 7/1973 | Cronson | |
| 4,264,241 A * | 4/1981 | Hock | 406/109 |
| 5,293,172 A * | 3/1994 | Lamberty et al. | 343/701 |
| 6,310,578 B1 * | 10/2001 | Ying | 343/702 |
| 6,822,394 B2 * | 11/2004 | Staines et al. | 315/39 |
| 2002/0134928 A1 * | 9/2002 | Jolivet | 250/234 |
| 2004/0190214 A1 | 9/2004 | Dommer et al. | |

FOREIGN PATENT DOCUMENTS

GB 619958 A 3/1949

* cited by examiner

*Primary Examiner*—Douglas W Owens
*Assistant Examiner*—Jae K Kim
(74) *Attorney, Agent, or Firm*—Scully, Scott, Murphy & Presser, P.C.

(57) ABSTRACT

The median frequency in the emission from a microwave generator (14), which operates in a pulsed manner, is shifted when the generator (14) operates between passive reflectors (23) whose axes are parallel thereto. In the axial direction, the reflectors (23) are approximately the same length (L) as the generator (14), with length matching through telescopic rods being preferable. However, the frequency is governed primarily by the distance (D) between the reflectors (23-23) between which the generator (14) is operated. Once desired resonance conditions have been found, for example for injection of microwave radiation into the mechanical structure of an external arrangement, this frequency relationship can be fixed by the magnitude of the length of the preferably telescopic coupling piece (16) between the resonator (13) and the antenna (18).

5 Claims, 1 Drawing Sheet

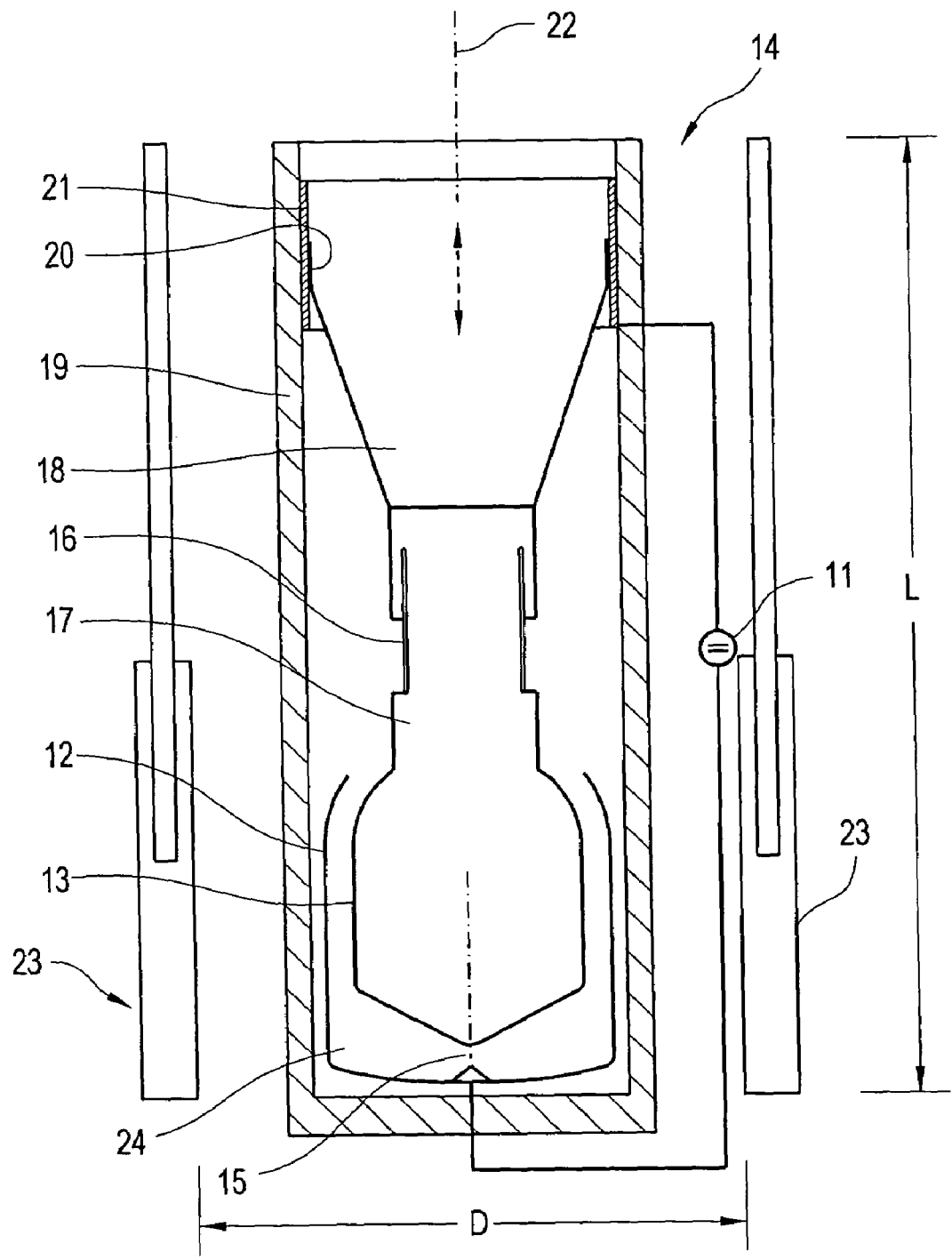

MICROWAVE GENERATOR WITH VARIABLE FREQUENCY EMISSION

BACKGROUND OF THE INVENTION

1. Field of the Invention

The invention relates to a variable-frequency microwave generator with a coaxial arrangement of a capacitive resonator and antenna for, in each case, a brief emission of a high-energy spectrum of damped sinusoidal oscillations during the discharge of the capacitor between the outer and inner electrodes of the resonator.

2. Discussion of the Prior Art

A generator of the above-mentioned type is described in DE 1 01 51 565 B4 as a mechanically tuneable resonant system, applied to a microwave generator of the type, which is explained functionally and in design terms in more detail in DE 1 03 13 286 B3 with reference to DE 1 01 51 565 B4. According to these documents, the capacitance, which is charged to a high voltage, between an inner electrode, which is in the form of a bottle, and a hollow-cylindrical outer electrode, which coaxially surrounds it, in an electromechanical resonator is discharged via a spark gap in front of the base of the inner electrode within a tubular surrounding housing that provides breakdown-resistant isolation. This leads to a rapidly rising and then severely oscillating current flow as well via an antenna, which is concentrically adjacent to the bottle, neck and widens in the form of a funnel for impedance matching. The discharge-current pulse with a typical duration of only a few nanoseconds leads to broadband emission of a microwave spectrum in the range from about 200 to 400 MHz, with such a high energy density that radio links that are formed in the relatively close vicinity can at least be adversely affected, and electronic circuits with physical structures matched to the resonance condition may in particular be subject to interference on the input side, or may even be destroyed.

In the case of a generator of this generic type, a variable-length electrical conductor is provided in the discharge current path upstream of the outer electrode for geometric resonance matching of the mid-wavelength of the emitted spectrum to the dimensions of said circuits. The spindle guide described there for axial movement of a short-circuiting link for adjustment of the length of the discharge current path admittedly allows continuous variation of the median frequency in the emitted spectrum, but requires a comparatively large and largely unused physical space, and is also mechanically quite complex. On the other hand, in practical use, there is normally no need at all for such frequency shifting; temporary displacement of the median frequency is frequently sufficient to observe the effect of instantaneous resonance matching in a specific constellation at the receiver end.

Against the background of this knowledge, the present invention is based on the technical problem of being able to at least temporarily, deliberately and effectively influence the emission frequency of a microwave generator of this generic type by means whose design is considerably less complex.

SUMMARY OF THE INVENTION

According to the invention, this object is achieved by the combination of the major features as described herein. According to these features, the microwave generator is operated between passive reflectors on both sides of the generator. The superimpositions, which occur during this process, of wave energy which is emitted in opposite senses and is reflected lead to a desirable influence on the pulse response, and thus on the median frequency in the emitted spectrum. For this purpose, the resonant frequency of the reflectors should correspond as well as possible to that of the resonator in the generator, as is achieved to an adequate extent when the length of the reflectors measured parallel to the axis of the generator approximately matches the generator length (comprising the resonator and funnel antenna).

The reflector dimensions transversely with respect to the generator longitudinal axis do not significantly affect the behaviour of the emitted pulse, for which reason the respective reflector may also be in the form of a cylindrical dipole, that is to say simply in the form of a rod, rather than a plate. A telescopic rod with a short and/or standardized length thus has the advantage that its length variation allows it to be easily matched to the given physical length of the currently available microwave generator.

In contrast, the mutual separation between the tuned reflectors, with the microwave generator being operated in the centre between them, has a major influence on the emitted spectrum. This is because, if one of the reflectors on the two sides moves towards the generator, this leads to the emitted energy pulse duration being lengthened, but without any significant influence on its peak height. This means that the operation between the passive reflectors leads to amplification of the energy to be emitted and thus of the external effect for example on the said circuit. In the frequency domain, this effect leads to raising of the lower frequencies in the emitted spectrum.

Once the optimum frequency emission in terms of the desired effect has been found by resonator adjustment, the microwave generator can be trimmed particularly easily to approximately this oscillation behaviour by appropriately shortening or lengthening a coupling piece between the resonator and the funnel antenna. Coupling pieces of different length can be inserted for this purpose, with the antenna being moved within the tubular surrounding housing; or a hollow-cylindrical coupling piece is designed to be telescopic in order to make it possible to move the funnel antenna relative to the resonator in a particularly simple manner, within specific limits, which are predetermined by the physical length of the surrounding housing.

BRIEF DESCRIPTION OF THE DRAWING

Further details relating to the solution according to the invention are also found in the drawing which shows an outline sketch, not to scale, of one preferred implementation example, and in the following detailed description herein below. The single FIGURE in the drawing shows an axial longitudinal section through a microwave generator which is operated between two passive reflectors and in which the distance between the resonator and the funnel-shaped antenna, which can be moved axially in the surrounding housing, is physically variable.

DETAILED DESCRIPTION OF THE INVENTION

The capacitance, which is charged from a high-voltage DC generator 11, between the tubular outer electrode 12 and the inner electrode 13, which is in the form of a bottle, of the coaxially formed microwave generator 14 is discharged at the free end of the inner electrode 13 via a spark gap 15, whose short-circuiting results in the behaviour of a quarter-wave resonator 24. This discharge leads to a rapidly rising and highly oscillating discharge current as well via a coupling piece 16 between the bottle neck 17 and the antenna 18, which widens in the form of a funnel, in the tubular surrounding housing 19. The bandwidth of the emission and the pulse length of the discharge current are governed primarily by the axial length of this conical antenna 18. The median frequency in the emitted spectrum is governed primarily by the length of the coaxial resonator 24 in the form of the concentric electrode pair 12-13, although the length dimensions of the bottle neck 17, of the coupling piece 16 and of the antenna 18 are also affected. The optimum emission power is achieved when the mechanical dimensions of the antenna 18 and of the outer electrode 12 are tuned as well as possible to electrical resonance with the oscillation behaviour of the resonator 24.

The frequency can be influenced by influencing the time interval which is required to emit the capacitive energy that is stored in the resonator 24, that is to say via the pulse length of the discharge current and thus the bandwidth of its spectrum. According to the invention, this can be achieved by the effective length of the antenna 18 itself, or of its coupling piece 16. Lengthening leads to a reduction in the median frequency in the emitted spectrum, with a wider bandwidth. This means that the pulse is shortened, but its amplitude is increased. The coupling piece 16 can be replaced for this purpose or, in a simpler form, can also be designed to be telescopic, as shown in the sketch. For the variation in the length of the antenna 18 that is associated with this, the latter is mounted in the electrically isolating surrounding housing 19 by means of an axially short hollow-cylindrical collar 20 adjacent to its larger funnel base. An electrically conductive connection for the current path via the DC generator 11 remains ensured in this case by means of a contact ring 21 on the hollow-cylindrical inner casing surface of the surrounding housing 19.

However, in order to influence the median frequency in the emission spectrum of the microwave generator 14 without any changes to its design, the resonator 24 is, according to the invention, operated with a variable reflector separation D between passive reflectors 23 which are oriented parallel to the generator longitudinal axis 22. Their length L parallel to the axis should be at least equivalent to that of the resonator 24, which should preferably extend, as shown in the sketch, over the entire axial length of the generator 14. In any case, the electrical natural resonance of the reflectors 23 should correspond as well as possible to that of the resonator 24. The lateral dimensions of the reflectors 23 in contrast do not significantly affect the emission behaviour, for which reason no metal plates are required here and just two simple rods, which are preferably telescopic as shown in the sketch, are sufficient for use as the reflectors 23, between which the microwave generator 14 is operated. Its effective emission can be influenced simply by varying the distance D between the passive reflectors 23 which are arranged on both sides.

The median frequency and/or the bandwidth of the emission of a microwave generator 14 which is operated on a pulsed basis are/is therefore shifted according to the invention without any change to the design of the generator 14, if the generator 14 is operated between passive reflectors 23, whose axes are parallel to it, and which should be tuned in the axial direction to resonance with the generator 14, for which purpose it is preferable for the length to be matched by means of telescopic rods. However, the primary factor governing the frequency of the emission is the mutual distance D between these reflectors 23-23, between which the generator 14 is operated. A reduction in the distance leads to the lower cut-off frequency in the spectrum being limited, with the pulse being lengthened and with its amplitude remaining approximately the same, which means an increase in the energy just on the basis of operation between passive reflectors 23.

Once desired resonance conditions have been found, for example by injecting of microwave energy into the external arrangement, this frequency relationship can be fixed by the magnitude of the length of the preferably telescopic coupling piece 16 between the resonator 24 and the antenna 18.

What is claimed is:

1. A variable-frequency microwave generator with a coaxial arrangement of a capacitive resonator and antenna for providing, in each case, a brief emission of a high-energy spectrum of damped sinusoidal oscillations during the discharge of the capacitance between outer and inner electrodes of the capacitive resonator, wherein, in order to influence a median frequency in the emission spectrum of the microwave generator, the resonator is operated with a variable reflector separation transversely of a longitudinal axis of the microwave generator between passive telescopable reflectors, which are oriented in parallel with the longitudinal axis of the microwave generator on opposite sides of said microwave generator.

2. A microwave generator according to claim 1, wherein the reflectors each have a length extending in parallel with the axis corresponding approximately to the length of the microwave generator.

3. A microwave generator according to claim 2, wherein the reflectors each have a variable length in the direction which extends in parallel with the microwave generator axis.

4. A microwave generator according to claim 1, wherein the reflectors have the form of telescopable rods.

5. A microwave generator according to claim 1, wherein the antenna is mounted for axial movement in an electrically conductive manner along an inner easing surface of a hollow-cylindrical surrounding housing for said microwave generator.

* * * * *